United States Patent [19]

Ross

[11] Patent Number: 4,901,319

[45] Date of Patent: Feb. 13, 1990

[54] TRANSMISSION SYSTEM WITH ADAPTIVE INTERLEAVING

[75] Inventor: Daniel P. Ross, Philadelphia, Pa.

[73] Assignee: General Electric Company, King of Prussia, Pa.

[21] Appl. No.: 169,699

[22] Filed: Mar. 18, 1988

[51] Int. Cl.[4] ............................................. G06F 11/10
[52] U.S. Cl. ...................................... 371/45; 371/2.1; 371/39.1; 371/41; 371/5.5
[58] Field of Search .................... 371/2, 40, 45, 43, 44, 371/46, 37, 32, 41, 39; 375/38, 40, 58; 370/84, 79

[56] References Cited

U.S. PATENT DOCUMENTS

| | | | |
|---|---|---|---|
| 3,506,961 | 4/1970 | Abramson | 371/41 |
| 3,534,264 | 10/1970 | Blasbalg et al. | 325/15 |
| 3,536,840 | 10/1970 | Sullivan | 179/2 |
| 3,632,882 | 1/1972 | Ciecierski et al. | 179/15 BA |
| 3,665,417 | 5/1972 | Low et al. | 340/172.5 |
| 3,862,373 | 1/1975 | Cohen et al. | 179/15 BV |
| 4,032,884 | 6/1977 | Gutleber | 340/146.1 E |
| 4,063,038 | 12/1977 | Kaul et al. | 179/15 BA |
| 4,309,771 | 1/1982 | Wilkens | 375/58 |
| 4,393,499 | 7/1983 | Evans | 371/5 |
| 4,394,642 | 7/1983 | Currie | 371/2 X |
| 4,539,684 | 9/1985 | Kloker | 371/46 |
| 4,547,887 | 10/1985 | Mui | 371/44 X |
| 4,691,176 | 9/1987 | Hsiung et al. | 331/2 |
| 4,720,829 | 1/1988 | Fukasawa | 371/32 X |
| 4,742,517 | 5/1988 | Takagi | 371/2 |
| 4,766,599 | 8/1988 | Miyazaki | 371/32 X |

OTHER PUBLICATIONS

John L. Ramsey, "Realization of Optimum Interleavers," I.E.E.E. Trans. Information Theory, vol. IT–16, No. 3, May 1970, pp. 338–345.

Primary Examiner—Jerry Smith
Assistant Examiner—Robert W. Beausoliel
Attorney, Agent, or Firm—Raymond E. Smiley; Clement A. Berard, Jr.

[57] ABSTRACT

A transmitter has an interleaver that sets an interleaving interval in accordance with the fading characteristic of a channel and transmits in another channel. The inteleaver duration is indicated by a synchronization signal and typically is 3 to 10 times the mean time between fades (decorrelation time). If the two channels substantially differ in frequency, a scaling factor can be used. A receiver has an adaptive deinterleaver that has a deinterleaving time in accordance with the synchronization signal occurring at the interleaving interval.

16 Claims, 2 Drawing Sheets

TRANSMISSION SYSTEM WITH ADAPTIVE INTERLEAVING

BACKGROUND OF THE INVENTION

The present invention relates to a transmission system using interleaving, and more particularly, to one wherein the interleaving interval adapts to channel conditions.

Communication systems frequently use error correcting codes to reduce the error rate. However, when the channel has a burst of errors due to fading, errors occur in adjacent bits, which the code may have difficulty correcting In order to overcome this problem, interleaving (time spreading) is used so that originally adjacent bits are non-adjacently transmitted in the channel. At the receiver the original bit order is restored (deinterleaved). Thus, when adjacent burst errors occur in the channel, they are non-adjacent when the original bit order is restored. This allows the error correcting code to efficiently operate. The interleaver time span or interval before transmitting originally adjacent bits is fixed and is usually between 3 and 10 times the duration of the expected mean time between the fades (decorrelation time) of a selected depth, e.g., at least 3 dB. Interleaving intervals longer than 10 times the channel decorrelation time do not result in appreciable error rate reduction. This interleaver time span usually is between 5 and 20 seconds for an SHF (super high frequency) signal propagating through the ionosphere. However, if rapid fading occurs, e.g., due to ionospheric scintillations, then the long interleaving interval will not accomplish appreciable error rate reduction compared to a shorter one. The only effect will be to unnecessarily extend message transmission time. For example, if the channel is a portion of a network, e.g., five nodes (4 links), and if there is a 10 second message transmission delay in each link, the time delay for conveying a message from the first to the last link will be 40 seconds. For many applications this time delay is not acceptable.

SUMMARY OF THE INVENTION

A transmitter comprises receiving means for receiving a signal in a first channel having fading characteristics; an adaptive interleaver having a first input means for receiving a data signal having a plurality of bits, a second input means coupled to said receiving means for receiving said first channel signal, means for controlling an interleaving interval in accordance with fading characteristics of said first channel, and an output means for providing all of said plurality of data signal bits in interleaved form; and means coupled to said interleaver output means for transmitting said data signal in a second channel.

A receiver comprises means for receiving an interleaved data signal of a variable interleaving interval and having a plurality of bits and a synchronization signal occurring at said interleaving interval; and an adaptive deinterleaver having a first input means coupled to said receiving means for receiving at least said data signal, a second input means for receiving at least the synchronization signal, means for controlling a deinterleaving interval in accordance with the synchronization signal, and an output means for providing a deinterleaved data signal with all of said bits.

DETAILED DESCRIPTION OF THE PREFERRED EMBODIMENTS

Figure 1:
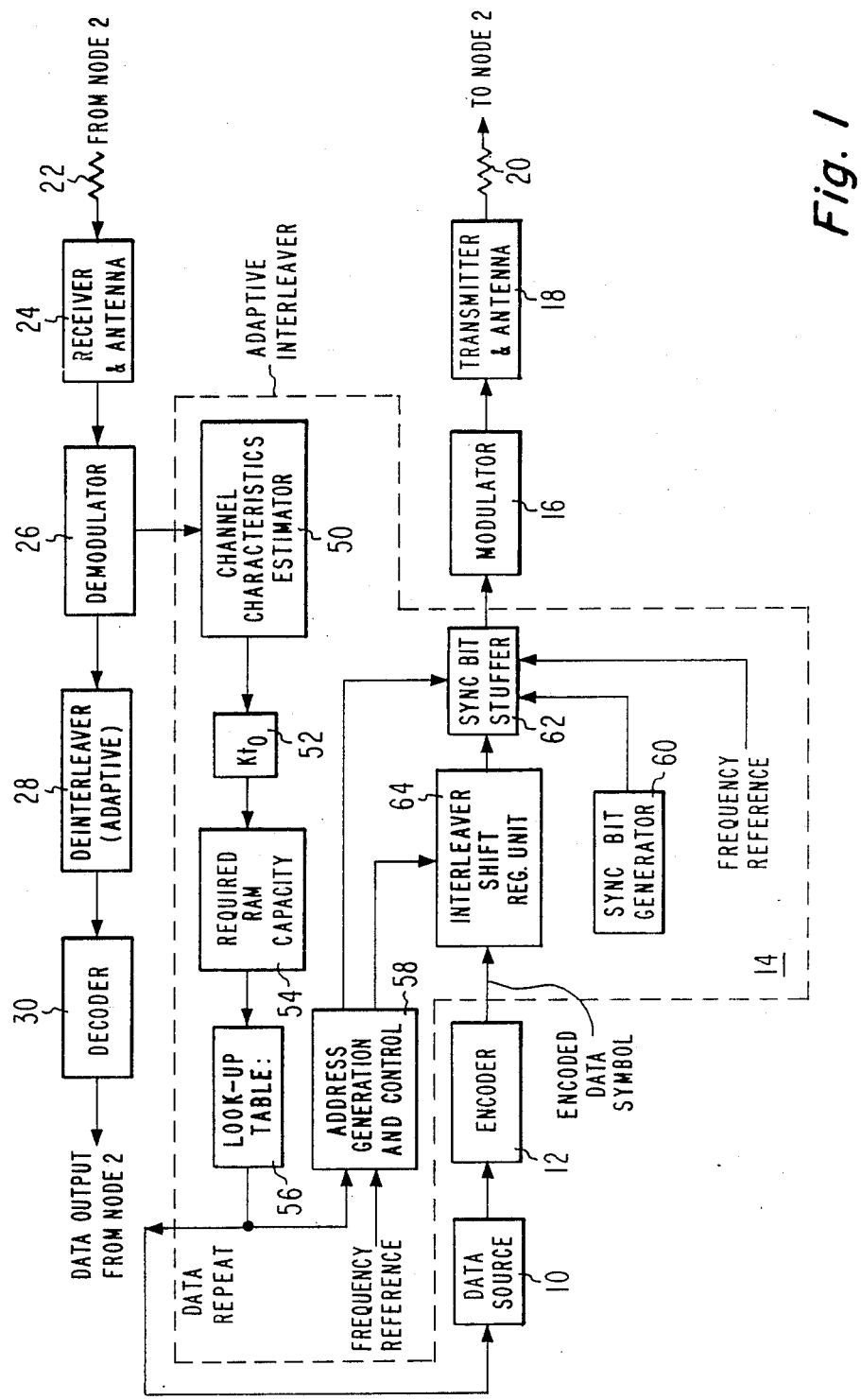
FIG. 1 is a block diagram of an embodiment of a first node of a transmission system in accordance with the invention.

In FIG. 1, a data source 10 provides a serial digital data signal having a plurality of bits. This data can originate at the first node (FIG. 1) or be received from another node (not shown) and is applied to an encoder 12. The encoder 12 encodes the data signal using a convolutional code although other coding schemes can be used. An adaptive interleaver 14 (described in detail below) receives the encoded data signal and provides an interleaved (time spread) data signal comprising all of the bits from the encoder 12 to a modulator 16, such as a DPSK (differential phase shift keying) modulator. The modulator 16 applies the modulated signal to a transmitter and antenna unit 18 for transmission through a free space channel 20 to a second system node (described below in conjunction with FIG. 2).

A data signal from the second node on a channel 22 is applied to a receiver and antenna unit 24 and then to a demodulator 26. The channel 22 is normally close in frequency to channel 20 so that their fading characteristics are similar. If the two channels are not close in frequency, then a scaling factor can be applied to the fading characteristic of the channel 22. In particular, the decorrelation time of channel 22 would be multiplied by a scaling factor equal to the frequency of channel 20 divided by the frequency of channel 22 to obtain an approximate decorrelation time for the channel 20. The output signal of the demodulator 26 is applied to the interleaver 14 and also to a deinterleaver 28, which can be the same as the adaptive deinterleaver 36 in FIG. 2 (described below) and performs the inverse operation as an interleaver 42 in FIG. 2 (described below). The output of the deinterleaver 28 is applied to a decoder 30, which performs the inverse operation of an encoder 40 in FIG. 2 (described below). The decoder 30 provides decoded data output from the second node, which data can be utilized at the first node or transmitted to yet another node.

At the second data node (FIG. 2 to which attention is now directed), the signals from the channel 20 are applied to a receiver and antenna unit 32 and then to a demodulator 34. The demodulated data signal is applied to an adaptive deinterleaver 36 that performs the inverse operation as that performed by the adaptive interleaver 14 of FIG. 1, i.e., the original bit order of the encoded signal is restored. The deinterleaved data signal is applied to a decoder 38 that performs an inverse operation to that performed by the encoder 12 of FIG. 1, i.e., the decoded data is now the same as that from the data source 10. The decoded data from the first node (FIG. 1) is present at the output of the decoder 38.

Data, which can be generated at the second node or transmitted to the second node from yet another node, is applied to an encoder 40 and then to an interleaver 42, which can be similar to the adaptive interleaver 14 of FIG. 1. Interleaver 42 also receives a signal from the demodulator 34 to perform adaptive interleaving. The interleaved data is then applied to a modulator 44 and the modulated data signal is then applied to a transmitter and antenna unit 46 and transmitted over the channel 22.

The adaptive interleaver 14 of FIG. 1 will now be described in detail. It comprises a channel characteristic estimator 50, such as shown in FIG. 5 of U.S. Pat. No. 4,691,176, that generates a digital signal in accordance with an estimate of the decorrelation time (mean time between fades), $t_o$, for the channel 20. As described in said patent, this decorrelation estimate signal is generated from two signals, an R.M.S. phase error signal averaged over a selected time interval and a signal in accordance with the periodicity of the phase error for said interval as determined by a zero crossing counter. These two signals are applied to a microprocessor (within estimator 50) that generates the decorrelation estimate signal. Basically, as the phase error increases, the decorrelation time decreases for a fixed phase error periodicity, and as the phase error frequency increases, the decorrelation time decreases for a fixed phase error.

The time interval is selected in accordance with anticipated channel characteristics. One second is typical.

The decorrelation time estimate signal from the estimator 50 is then applied to a first digital multiplier 52 that multiplies the input signal by "K", wherein K is between about 3 and 10, preferably 10. A factor of 3 is about the minimum for an appreciable reduction in error rate, while more than 10 does not result in any further appreciable error rate reduction. The value of K can also include the scaling factor to obtain a correct decorrelation time when the channels 20 and 22 are far apart in frequency as discussed above. The thus multiplied signal is then applied to a second digital multiplier 54 that computes the required capacity of an interleaver SR (shift register) unit 64 (described below) by multiplying the input signal, $Kt_o$, by the data rate. If desired, the multipliers 52 and 54 can be implemented as a single multiplier.

The signal from the second multiplier 54 is then applied to a ROM (read only memory) 56 look up table of the number of bits in each row, which determines how many rows of SR are required to provide adequate interleaving capacity. Typically, there are only four or five settings of the SR unit 64 in order to minimize the number of row changes, which can be difficult for the deinterleaver 36 of FIG. 2 to follow. One output of the ROM 56 is applied to the data source 10 so that it repeats data when a change in the number of rows is required. The data is repeated in order to ensure that the deinterleaver 36 of FIG. 2 receives the data since time delays in synchronization between the nodes can cause a loss of received data. The other output of the ROM 56 is applied to an address and control circuit generator 58, which also receives a reference frequency signal, and comprises a circulating row address pointer (not shown), i.e., the addresses are periodically repeated such as by having a counter (not shown) that counts the reference frequency signal, which counter is reset when it reaches a selected count corresponding to a selected row. The elements 50, 52, 54, 56 and 58 comprise a means for controlling the interleaving interval.

One output of the address generator 58 is applied to the interleaver SR unit 64 comprising a plurality of rows of shift registers with successive rows having successively increasing length (number of shift register memory locations) and thus, successively increasing time delay. The signal from the address generator 58 causes an input commutator (not shown) of the SR unit 64 to place (write in) successive bits from the encoder 12 into successive rows with successively increasing length starting with a top row of minimum length. When the selected last row is reached, the SR unit 64 resets to the initial top minimum length row. The selected last row is selected in accordance with the fading characteristic of the channel 22 as described above and usually will not be the last (bottom) row of the SR unit 64. The bits stored in each of the first (left most) memory locations of the shift registers are then shifted one location to the right. New successive bits are then sequentially written into the left most memory locations of successive rows and then shifted one location to the right. This operation is repeated. Simultaneous with write in, the shift registers are successively read out using an output commutator (not shown) of the SR unit 64 controlled by the address pointer. The read out starts with the top row and ends with the selected last row, while new input data bits are successively placed into successive rows. The procedure is then repeated by resetting the commutator to the top row. Naturally, at first what is read out of the various rows contains no useful information. However, as successive bits are read into the various registers they will become full and then the read out information will be what was written in and, therefore, will be useful information. All this is in accordance with the well known interleaving process.

A sync (synchronization) bit generator 60 provides a pattern of sync bits to a sync bit inserter or stuffer 62. The sync bits are distinct from the encoded data bits, i.e., a sync pattern is selected that cannot be provided by the encoder 12 for any data signal, and thus the sync bits can be recognized as such at the second node. The stuffer 62 can comprise a memory that stores the interleaved data from the SR unit 64 at one rate and then is periodically read out at a higher rate. This creates gaps in the data into which the sync bit pattern can be inserted. The other output from the address generator 58 is applied to the stuffer 62 and determines when the sync signal is inserted into the interleaved data stream. The spacing between successive sync patterns equals the time to place one bit in each of the selected number of SR rows.

Figure 2:
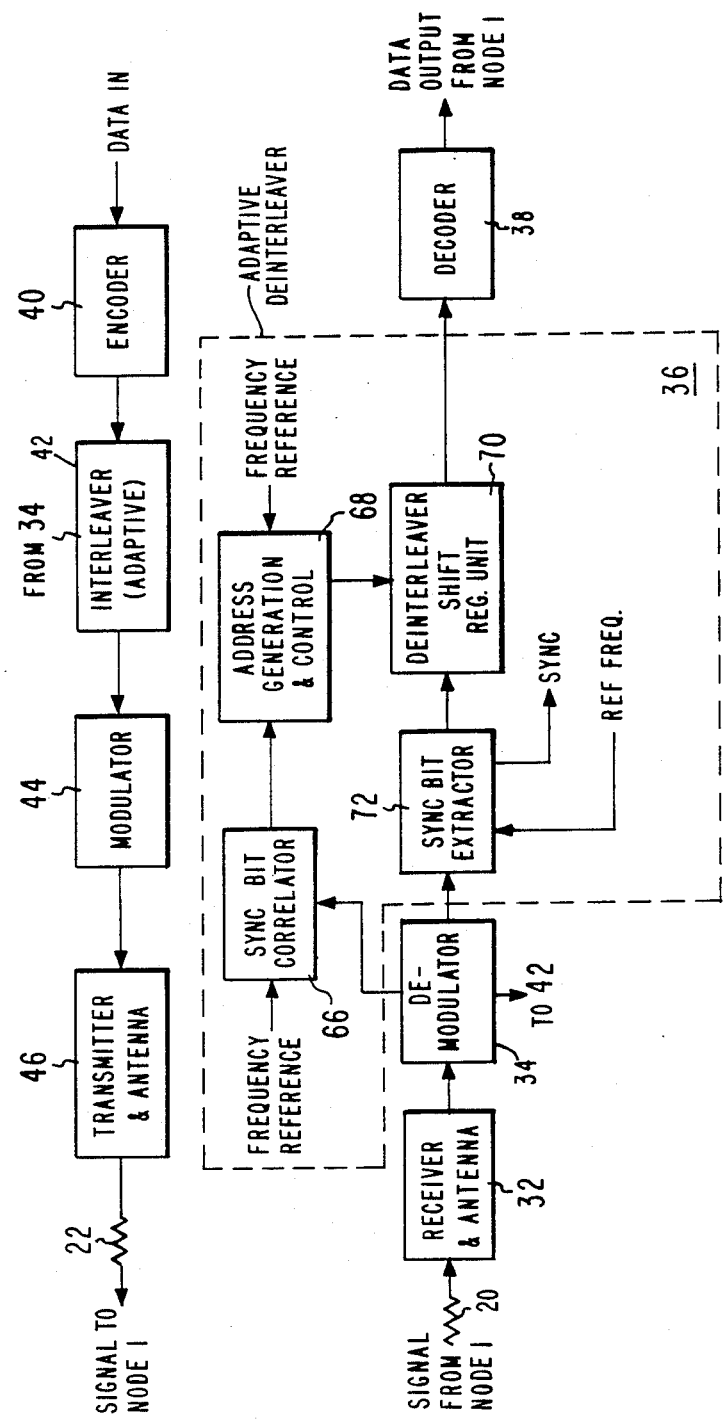
FIG. 2 is a block diagram of an embodiment of a second node of a transmission system in accordance with the invention.

In the adaptive deinterleaver 36 of FIG. 2, the output from the demodulator 34 is applied to a sync bit extractor or separator 72. The extractor 72 comprises the inverse of the stuffer 62 of FIG. 1, i.e., when the sync bits are recognized, the data is blanked for the sync signal duration creating gaps and then the data is written into a memory. Thereafter, the data is read out of the memory at a slower rate than the write rate in order to close up the gaps in the data. The extracted sync bits are available for further use, e.g., a display of the interleaving interval. The data with sync bits removed is then applied to a deinterleaver SR unit 70. A sync bit correlator 66 also receives the signal from the demodulator 34. The correlator 66 comprises a digital comparator that compares the incoming bits to a stored signal pattern and when a match occurs provides an output signal to address generator and control circuit 68. The elements 66 and 68 comprise a means for controlling the deinterleaving interval in accordance with the synchronization signal. The circuit 68 comprises a circulating address pointer that provides sequential row addresses to an input commutator (not shown) of a deinterleaver SR unit 70 having a plurality of shift registers arranged in rows. The shift registers have varying length corresponding to the lengths of the shift registers in the SR unit 64. However, the row with the longest length or time delay is now the initial row and successive rows have successively shorter time delays so that the original bit order is restored by an output commutator (not shown) of the SR unit 70, which output commutator is also controlled by the address pointer in a manner similar to that described above for the SR unit 64. When a change in the number of rows occurs, the generator 68 causes a row to be cleared by generating a reset signal and the row then awaits the repeat data transmission.

Interleaver and deinterleaver (called "unscrambler") design is discussed in detail in the article "Realization of Optimum Interleavers" by J. L. Ramsey, I.E.E.E. Trans. on Information Theory, Vol. IT-16, No. 3, May 1970, pp. 338–345. Further, as known in the art, if the data rate is low enough, e.g., lower than 20 Kilobits/sec., a RAM (random access memory) can be used as a shift register by writing into memory locations then reading out the stored data in a selected sequence. The sequence is determined by the selected time delay and an addressing algorithm.

It will, therefore, be appreciated that the interleaver and deinterleaver time span (number or rows) used is the minimum necessary to obtain good error correction in view of the actual channel fading conditions, thereby minimizing transmission time delay as compared to the prior art, which has a fixed interleaving interval, and, therefore, a long time delay, especially when the system comprises several nodes.

What is claimed is:

1. A transmitter comprising:
   receiving means for receiving a signal in a first channel having fading characteristics;
   an adaptive interleaver having a first input means for receiving a data signal having a plurality of bits, a second input means coupled to said receiving means for receiving said first channel signal, for controlling an interleaving interval in accordance with fading characteristics of said first channel, and an output means for providing all of said plurality of data signal bits in interleaved form; and
   means coupled to said interleaver output means for transmitting said data signal in a second channel.

2. A transmitter as claimed in claim 1 wherein the time interval between successive fades varies and wherein said interleaving interval is between about 3 and 10 times the mean time between fades of said first channel.

3. A transmitter as claimed in claim 2 wherein said interleaving interval is about 10 times said mean time.

4. A transmitter as claimed in claim 1 wherein the time intervals between successive fades various and wherein said interleaving interval is between about 3 and 10 times the mean time of said time intervals of said first channel multiplied by a ratio of the frequency of said first channel to that of the second channel.

5. A transmitter as claimed in claim 1 wherein said output means also provides a synchronization signal occurring at said interleaving interval.

6. A transmitter as claimed in claim 1 wherein said controlling means comprises a channel characteristics estimator coupled to said second input means; multiplying means coupled to said estimator; a memory coupled to said multiplying means; an address generator coupled to said multiplying means; said adaptive interleaver further comprising a synchronization generator; a synchronization inserter coupled to said synchronization generator, said first output means, and said address generator; and an interleaver shift register unit coupled to said synchronization inserter, said address generator, and said first input means.

7. A transmitter as claimed in claim 1, further comprising an encoder having an input means for receiving said data signal and an output coupled to said adaptive interleaver first input means.

8. A transmitter as claimed in claim 7 wherein said encoder comprises a convolutional encoder.

9. A transmitter as claimed in claim 1 wherein said transmitting means comprises a modulator coupled to said adaptive interleaver output means, and a transmitter and antenna unit coupled to said modulator.

10. A transmitter as claimed in claim 1 wherein said first channel receiving means comprises a receiver and antenna unit, a demodulator coupled to the receiver and antenna unit and to said adaptive interleaver second input means, a deinterleaver coupled to said demodulator, and a decoder coupled to said deinterleaver.

11. A receiver comprising:
    means for receiving an interleaved data signal of a variable interleaving interval and having a plurality of bits and a synchronization signal occurring at said interleaving interval; and
    an adaptive deinterleaver having a first input means coupled to said receiving means for receiving at least said data signal, a second input means for receiving at least the synchronization signal, for controlling a deinterleaving interval in accordance with the synchronization signal, and an output means for providing a deinterleaved data signal with all of said bits.

12. A receiver as claimed in claim 11 wherein said controlling means comprises a synchronization signal correlator coupled to said second input means, and an address generator coupled to said correlator; said adaptive deinterleaver comprising a deinterleaver shift register unit coupled to said output means and to said address generator; and a synchronization signal extractor coupled to said shift register unit and to said first input means.

13. A receiver as claimed in claim 11 further comprising a receiver and antenna unit; and a demodulator coupled to said receiver and antenna unit and to both of said input means.

14. A receiver as claimed in claim 11, further comprising a decoder coupled to said output means.

15. A receiver as claimed in claim 14 wherein said decoder comprises a convolutional decoder.

16. A transmission system comprising:
    first receiving means for receiving a signal in a first channel having fading characteristics;
    an adaptive interleaver having a first input means for receiving a data signal having a plurality of bits, a second input means coupled to said first receiving means for receiving said first channel signal for controlling an interleaving interval in accordance with fading characteristics of said first channel, and an output means for providing all of said plurality of data signal bits in interleaved form and a synchronization signal occurring at said interleaving interval;
    means coupled to said interleaver output means for transmitting said data signal in interleaved form in a second channel;
    second receiving means for receiving said data signal in interleaved form and said synchronization signal; and an adaptive deinterleaver having a first input means coupled to said second receiving means for receiving at least said data signal, a second input means coupled to said second receiving means for receiving at least said synchronization signal for controlling a deinterleaving interval in accordance with the synchronization signal, and an output means for providing a deinterleaved data signal with all of said bits.

* * * * *

UNITED STATES PATENT AND TRADEMARK OFFICE
CERTIFICATE OF CORRECTION

PATENT NO. : 4,901,319

DATED : February 13, 1990

INVENTOR(S) : Daniel P. Ross

It is certified that error appears in the above-identified patent and that said Letters Patent is hereby corrected as shown below:

Column 1, line 15, after "correcting" insert a period (.).

Column 3, line 5, "characteristic" should be --characteristics--.

Column 3, line 37, "S2" should be --52--.

Column 5, line 47, after "mean time" insert --of said time intervals--.

Column 5, line 52, "various" should be --varies--.

Signed and Sealed this

Third Day of December, 1991

Attest:

HARRY F. MANBECK, JR.

*Attesting Officer*       *Commissioner of Patents and Trademarks*